(12) United States Patent
Hamada

(10) Patent No.: US 8,157,430 B2
(45) Date of Patent: Apr. 17, 2012

(54) BACKLIGHT DEVICE AND PLANAR DISPLAY DEVICE USING THE SAME

(75) Inventor: Tetsuya Hamada, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 249 days.

(21) Appl. No.: 12/527,336

(22) PCT Filed: Oct. 10, 2007

(86) PCT No.: PCT/JP2007/069731
§ 371 (c)(1), (2), (4) Date: Aug. 14, 2009

(87) PCT Pub. No.: WO2008/099531
PCT Pub. Date: Aug. 21, 2008

(65) Prior Publication Data
US 2010/0027291 A1    Feb. 4, 2010

(30) Foreign Application Priority Data

Feb. 16, 2007 (JP) .................................. 2007-035625

(51) Int. Cl.
*F21V 7/22* (2006.01)
(52) U.S. Cl. ........ 362/613; 362/294; 362/612; 362/631; 362/249.02
(58) Field of Classification Search ................. 362/612, 362/613, 630, 631, 294, 373, 249.02
See application file for complete search history.

(56) References Cited

U.S. PATENT DOCUMENTS

| | | | |
|---|---|---|---|
| 7,175,329 B1* | 2/2007 | Chou | 362/612 |
| 7,832,897 B2* | 11/2010 | Ku | 362/249.02 |
| 7,936,415 B2* | 5/2011 | Park | 349/58 |
| 8,058,781 B2* | 11/2011 | Lee et al. | 313/46 |
| 2005/0280017 A1 | 12/2005 | Oshio et al. | |
| 2008/0049164 A1* | 2/2008 | Jeon et al. | 349/61 |
| 2009/0027882 A1* | 1/2009 | Kim et al. | 362/234 |
| 2009/0103295 A1* | 4/2009 | Wang | 362/234 |
| 2009/0185393 A1* | 7/2009 | Kang et al. | 362/612 |
| 2009/0237936 A1* | 9/2009 | Ku | 362/249.14 |
| 2010/0033976 A1* | 2/2010 | Sun et al. | 362/382 |

FOREIGN PATENT DOCUMENTS

| | | |
|---|---|---|
| JP | 2002-232009 A | 8/2002 |
| JP | 2002-368285 A | 12/2002 |
| JP | 2005-283852 A | 10/2005 |
| JP | 2005-353914 A | 12/2005 |
| JP | 2006-11239 A | 1/2006 |
| JP | 2006-310123 A | 11/2006 |
| JP | 2007-305435 A | 11/2007 |

* cited by examiner

*Primary Examiner* — John A Ward
(74) *Attorney, Agent, or Firm* — Birch, Stewart, Kolasch & Birch, LLP

(57) ABSTRACT

Electrode terminals (33*a*, 33*b*) of an LED (3) and a mounting wiring (42) of an FPC (4) are bonded by using a conductive adhesive, and a metal slug (31) of the LED (3) and a heat dissipation wiring (43) of the FPC (4) are bonded by using the conductive adhesive. The heat dissipation wiring (43) corresponds to each of the LEDs (3) and isolates the LEDs one from the other, not permitting electricity to be carried between them.

4 Claims, 6 Drawing Sheets

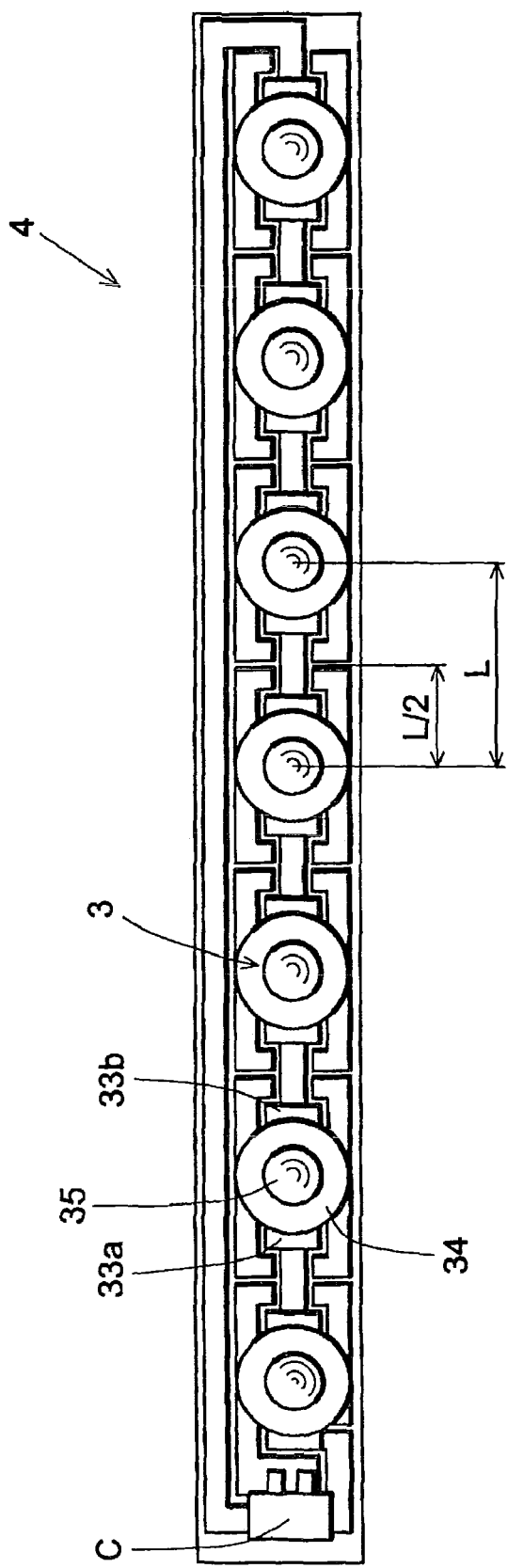

BACKLIGHT DEVICE AND PLANAR DISPLAY DEVICE USING THE SAME

BACKGROUND OF THE INVENTION

1. Field of the Invention

The present invention relates to a backlight device, and more particularly to a side-lit backlight device employing a point light source.

2. Description of the Related Art

In nonluminous display devices such as liquid crystal display devices, so called backlight devices that illuminate display panels from behind are generally provided. These backlight devices divide into a direct-lit type, a side-lit type, a planar light source type, etc., and the side-lit type is widely adopted these days with the trend for slimmer and lighter display devices.

In a side-lit backlight device, light from a light source is led into a light guide plate through a side surface thereof and is made to travel inside the light guide plate by total reflection; in addition, light is partly reflected on a reflective sheet fitted on a back surface of the light guide plate; thus light emerges through a main surface of the light guide plate to act as a planar light source, to thereby illuminate a back surface of a display panel.

As light sources, although cold cathode tube lamps, which are linear light sources, have conventionally been used, with increasing consideration to the environment these days, LEDs (light emitting diodes), which are point light sources, have come to be increasingly used.

The light emission efficiency of LED devices, however, is about 10% at present, meaning that the remaining 90% of the light they emit is dissipated as heat. On the other hand, it is known that the light emission efficiency of an LED device decreases as temperature rises. According to one account, as temperature increases by 1° C., light emission efficiency decreases by approximately 1%.

Accordingly, if the heat generated by an LED device is left undealt with, the heat generated by the LED device itself diminishes the light emission efficiency and shortens the lifetime. In particular, when an increased number of LEDs are mounted with a view to achieving high brightness in backlight devices, the total amount of heat generated by the LEDs is considerably large; thus making the above problem notable.

Thus, for example, a technology is proposed (e.g. Patent Documents 1 and 2) according to which, apart from a mounting conductor for an LED, a heat dissipation conductor is formed on a circuit board, and in addition, a container forming the LED is connected to the heat dissipation conductor via an insulating bonding agent to conduct the heat generated by the LED device to the heat dissipation conductor formed on the circuit board via the container and the bonding agent, so as to dissipate the heat therefrom into the air.

Patent Document 1: JP-A-2005-283852 Publication
Patent Document 2: JP-A-2006-11239 Publication

SUMMARY OF THE INVENTION

Problems to be Solved by the Invention

However, when the electrode terminals of an LED are mounted on a circuit board, a conductive adhesive such as solder is used. Thus, when an insulating bonding agent is used for bonding the LED container and the circuit board as in the proposed technology described above, it is necessary to use two types of adhesive. Thus, the proposed technology requires at least one extra process for applying an adhesive to the circuit board, possibly complicating the process and thus diminishing the productivity.

In view of those conventional problems, an object of the present invention is to provide, without complicating a manufacturing process, a backlight device that can efficiently dissipate heat generated by a light emitting device and that thus offers high light emission efficiency and a long lifetime.

Another object of the invention is to provide a light source device that has a point light source mounted on a flexible printed circuit board but that nevertheless is formed in such a manner that the point light source does not come off from the flexible printed circuit board under bending etc.

Still another object of the invention is to provide an inexpensive planar display device that offers enhanced image display quality stably.

Means for Solving the Problem

A backlight device includes a light guide plate and a plurality of point light sources mounted on a flexible printed circuit board disposed near a side surface of the light guide plate.

In this backlight device, a point light source includes a semiconductor light emitting device, a metal slug fitted with the semiconductor device, and an electrode terminal, with part of the metal slug exposed at a mounting surface side. The flexible printed circuit board includes a mounting conductor connected to the electrode terminal of a point light source and a heat dissipation conductor corresponding to a point light source and separated from an adjacent heat dissipation conductor so as not to conduct to one another. Furthermore, the electrode terminal of a point light source and a mounting conductor of the flexible printed circuit board are bonded together with a conductive adhesive; the metal slug of a point light source and a heat dissipation conductor of the flexible printed circuit board are bonded together with a conductive adhesive.

Here, with a view to preventing a point light source from coming off easily from the flexible printed circuit board even when the flexible printed circuit board is bent etc., it is preferable that two adjacent heat dissipation conductors be separated from each other substantially at the midpoint between two adjacent point light sources.

Moreover, it is preferable that a white resin layer be formed on the mounting surface of the flexible printed circuit board.

Furthermore, in a planar display device including a display panel and a backlight device fitted on the back surface side of the display panel, it is preferable that a backlight device as described above be employed. That is, a planar display device that includes a backlight device as described above and a display panel receiving the light emitted from the backlight device can also be said to be within the scope of the present invention

Advantages of the Invention

In a backlight device according to the present invention, since an FPC is used as a circuit board, light weight is achieved, and compared with conventional devices in which a circuit board formed of glass epoxy or the like is employed, high heat dissipation properties are achieved. Moreover, the metal slug of a point light source and the corresponding heat dissipation conductor are bonded together with the same conductive adhesive used for mounting the point light sources; thus, without an extra manufacturing process, the backlight device can be produced with no drop in the production efficiency. In addition, though a metal slug and a heat dissipation conductor are bonded together with a conductive adhesive, two adjacent heat dissipation conductors are separated from each other so as not to conduct to each other; thus no short circuiting occurs.

Moreover, when two adjacent heat dissipation conductors are separated from each other substantially at the midpoint between two adjacent point light sources, even when the flexible printed circuit board is bent etc., the point light source is less likely to come off from the flexible printed circuit board.

Moreover, when a white resin layer is formed on the mounting surface of the flexible printed circuit board, the light radiated from the point light source is then reflected by the white resin layer, increasing the illumination efficiency.

Moreover, in a planar display device, since a backlight device as described above is employed as its backlight device, cost reduction and stable enhanced image display quality can be achieved.

BRIEF DESCRIPTION OF DRAWINGS

FIG. 4 A plan view of the FPC shown in FIG. 3 with LEDs and a connector mounted thereon.

LIST OF REFERENCE SYMBOLS

1 Liquid crystal panel (display panel)
2 Backlight device
3 LED (point light source)
4 FPC (flexible printed circuit board)
32 LED device (semiconductor light emitting device)
31 Metal slug
33*a*, 33*b* Electrode terminals
42 Mounting conductor
43 Heat dissipation conductor
44 Heat dissipation conductor

DETAILED DESCRIPTION OF THE INVENTION

A backlight device and a planar display device will now be described with reference to the accompanying drawings. It is to be understood, however, that these embodiments are not meant to limit the present invention in any way.

Figure 1:
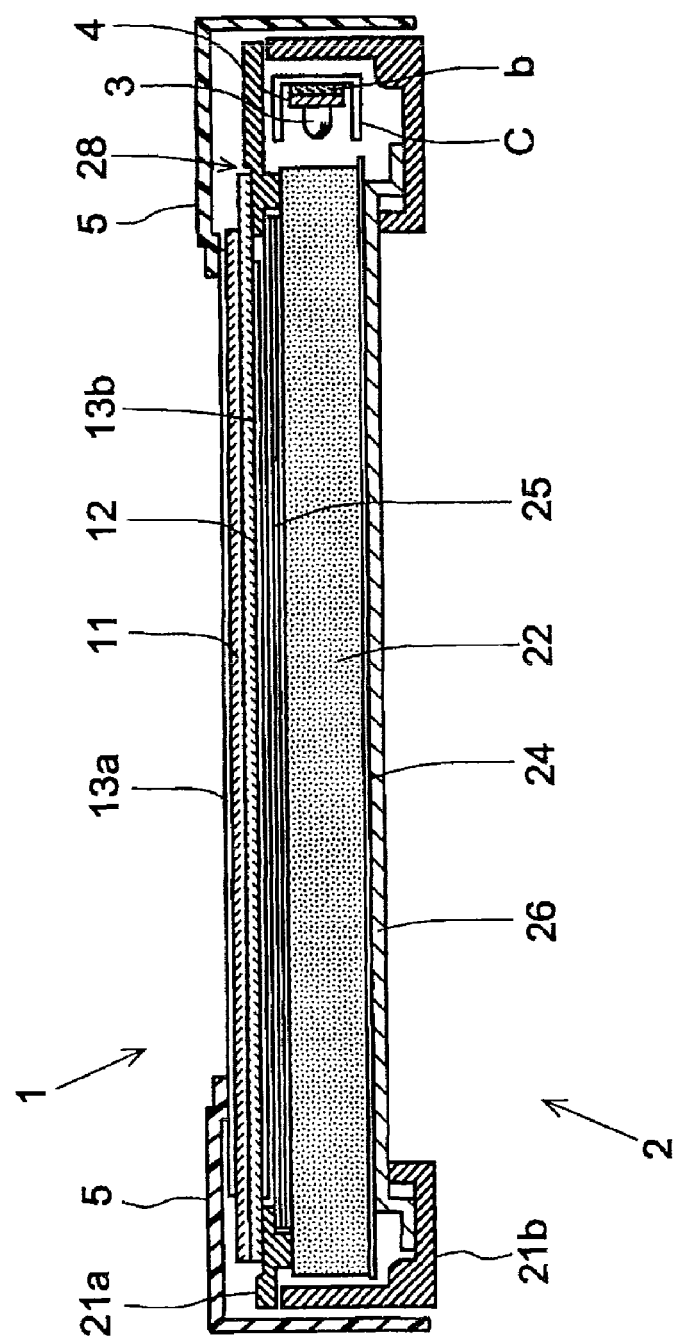
FIG. 1 A schematic view showing a planar display device as one embodiment of the present invention.

FIG. 1 is a sectional schematic view showing an example of a liquid crystal display device (planar display device) and a backlight device. As shown in FIG. 1, the liquid crystal display device includes a backlight device 2 and a liquid crystal panel 1.

In the backlight device 2, a box-shaped lower chassis (frame body) 21*b* open at the top and bottom faces thereof is fitted with a back sheet metal 26 so as to cover the bottom-face opening. On the back sheet metal 26, a box-shaped light guide plate 22 is fitted.

On the reverse surface of the light guide plate 22, a reflective sheet 24 is fitted; on the front surface of the light guide plate 22, three optical sheets 25 are fitted. On the inner wall of the lower chassis 21*b* that faces the side surface of the light guide plate 22, an FPC (flexible printed circuit board) 4—having a plurality of LEDs (point light sources) 3 mounted thereon at a predetermined interval in the length direction thereof—is fixed with double-faced adhesive b, with the FPC 4 housed inside a reflective case C having a square-cornered rectangular section with an opening part facing the side surface of the light guide plate 22. The structures of the LED 3 and the FPC 4 will be described later.

An upper chassis (frame body) 21*a* having an opening part formed therein to let pass light emerging from the light guide plate 22 is so fitted as to cover the top-face opening of the lower chassis 21*b*; by the upper chassis 21*a* and the lower chassis 21*b*, the back sheet metal 26, the reflective sheet 24, the light guide plate 22, and the optical sheets 25 are held together.

On the other hand, in the liquid crystal panel 1, liquid crystal (unillustrated) is sealed in between a pair of glass substrates 11 and 12 disposed apart from and opposite each other. An outer edge part of the glass substrate 12 extends outward beyond the glass substrate 11 and, on this extended part, a large number of electrode terminals (unillustrated) that apply voltages to pixel electrodes formed on the surface of the glass substrate 12 are formed. On the front and reverse surfaces of the liquid crystal panel 1, polarizing plates 13*a* and 13*b* are fitted respectively.

On a step part 28 formed around the rim of the opening part of the upper chassis 21*a* of the backlight device 2, a peripheral part of the liquid crystal panel 1 is placed. A bezel 5 overlaps this peripheral part of the liquid crystal panel 1; the bezel 5 and the upper and the lower chassis 21*a* and 21*b* are fixed together such that the liquid crystal panel 1 and the backlight device 2 are put together to constitute the liquid crystal display device.

Figure 2:
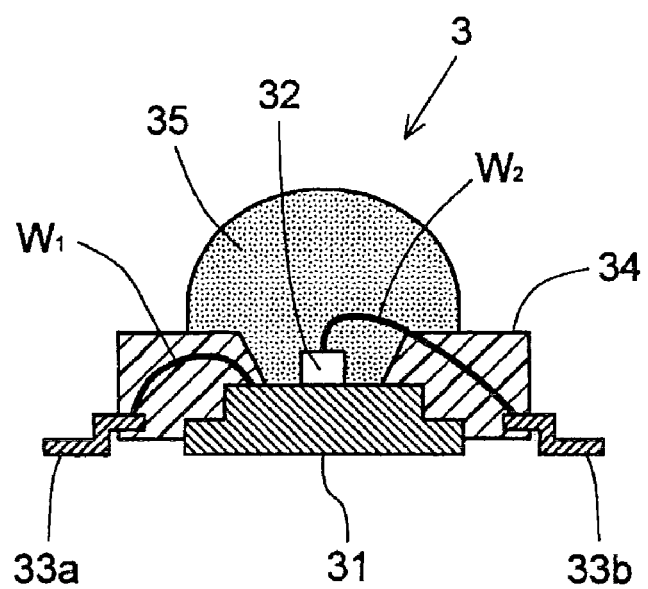
FIG. 2 A schematic sectional view of an LED.

FIG. 2 is a schematic view showing the structure of the LED 3 as a point light source. The LED 3 shown in FIG. 2 includes a metal slug 31 formed of metal such as Cu or Al, an LED device (semiconductor light emitting device) 32 fixed on the top surface of the metal slug 31 with a conductive adhesive (unillustrated) based on resin, and a pair of electrode terminals 33*a* and 33*b* disposed at opposite positions across the metal slug 31, apart from the metal slug 31.

The electrode terminal 33*a* and the metal slug 31 are connected together with a bonding wire $W_1$; the electrode terminal 33*b* and a top-surface electrode (unillustrated) of the LED device 32 are connected together with a bonding wire $W_2$. A peripheral part of the metal slug 31 and part of the pair of electrodes 33*a* and 33*b* are sealed with an insulating resin 34. On the top surface of the metal slug 31, the LED device 32 is sealed with a translucent resin 35 into the shape of a dome; here, the dome-shaped translucent resin 35 also functions as a lens.

In FIG. 2, the slug 31 is formed only on the bottom surface side of the LED 3. This, however, is not limited; the slug 31 may extend to the vicinity of a side surface of the insulating resin 34. This increases the surface area of the slug 31 and thus increases an area that can dissipate heat. Furthermore, this is preferable because the slug 31 is then located not only at the bottom surface side of the LED 3, which is the side thereof closer to the FPC 4, but also at the light emitting side of the LED 3, and thus heat dissipates at both the bottom surface side and the light emitting side of the LED 3.

As will be described later, in the LED 3, part of the pair of electrode terminals 33a and 33b and the bottom surface of the metal slug 31 extend out of, and are exposed through, the insulating resin 34.

Figure 3:
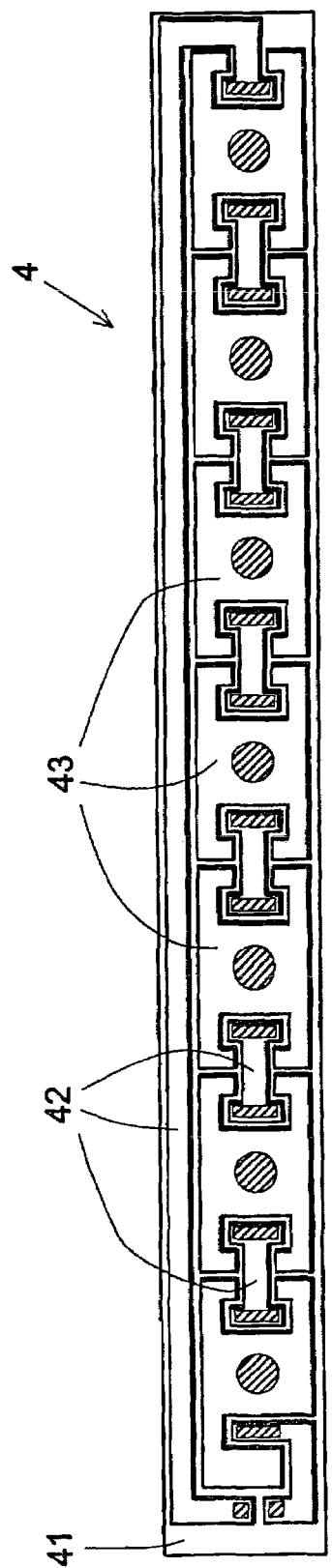
FIG. 3 A plan view showing a configuration of conductors on an FPC.

FIG. 3 is a plan view showing an example of the FPC 4. The FPC 4 includes a flexible band-shaped FPC base 41, a mounting conductor 42 and a heat dissipation conductor 43 formed on the surface of the FPC base 41. Note that the mounting conductor 42 and the heat dissipation conductor 43 are separated from each other across a predetermined gap.

In the mounting conductor 42, regions (hatched rectangular parts in the figure) to which the electrode terminals of each LED are fixed are formed; in the heat dissipation conductor 43, a region (hatched circular part in the figure) to which the metal slug of each LED is fixed is formed. Between the heat dissipation conductors 43 and 43 corresponding different LEDs, a gap is formed, so that they do not conduct to each other.

When the LED 3 is mounted on the FPC 4 described above, to regions (hatched regions in the figure) to which the electrode terminals 33a and 33b and the metal slug 31 of the LED 3 are fixed, a conductive adhesive such as solder is applied at once by screen printing or the like. As shown in FIG. 4 (a plan view showing the FPC 4 with the LED 3 and a connector C mounted thereon), the LED 3 is mounted at predetermined positions on the FPC 4 and fixed with a conductive adhesive (unillustrated). (Note that the connector C is fitted to part to which external power is supplied.)

To fix the electrode terminals 33a and 33b and the metal slug 31 of the LED 3 onto the FPC 4, two types of adhesive, a conductive adhesive and an insulating adhesive, are conventionally used. Thus, two processes are required each for applying one adhesive to the FPC. However, with the present invention, the same conductive adhesive can be used; thus the adhesive can be applied in one process, with increased productivity.

To increase illumination efficiency, it is preferable that a white resin layer be formed on the mounting surface of the FPC 4. The reason is that the light radiated from the LED 3 is then reflected by the white resin layer to enter the light guide plate 22 (shown in FIG. 1) through the side surface thereof.

The heat generated by the LED device 32 passes through the metal slug 31 and conducts to the heat dissipation conductor 43 via the conductive adhesive. As is understood from FIGS. 3 and 4, the heat dissipation conductors 43 are formed widely on the surface of the FPC 4. Thus, the heat generated by the LED device 32 dissipates into the air from the wide heat dissipation conductors 43, efficiently suppressing a rise in the temperature of the LED device 32.

As mentioned above, by use of the same conductive adhesive, the electrode terminals 33a and 33b and the metal slug 31 of the LED 3 are fixed to the FPC 4. Thus, if the heat dissipation conductors 43 of different LEDs 3 are in contact with each other, a current passes through the heat dissipation conductors 43 via the metal slug 31 and cause short circuiting. It is therefore necessary to separate the heat dissipation conductors 43 so that they do not conduct to each other.

Although there is no particular restriction on where to separate the different heat dissipation conductors 43, it is preferable that they be separated at the middle (L/2) of the distance L between two LEDs as shown in FIG. 4.

Figure 5A:
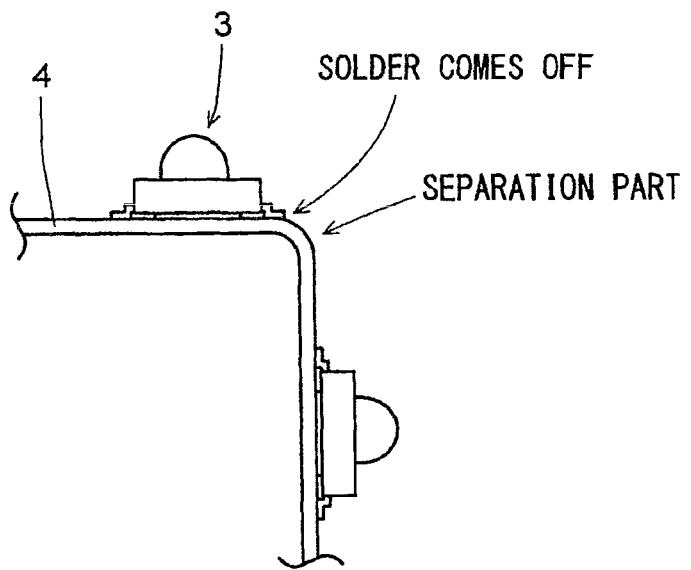
FIG. 5A A diagram illustrating an example in which a defect occurs when an FPC with LEDs mounted thereon is bent.

Generally, since the FPC 4 is flexible, it tends to bend particularly at a separation part where no heat dissipation conductor 43 is formed. Thus, as shown in FIG. 5A, if a separation part between different heat dissipation conductors 43 is close to the LED 3, the FPC 4 may bend and sag down near the LED 3, causing the part where the LED 3 is fixed with solder to come off from the FPC 4.

Figure 5B:
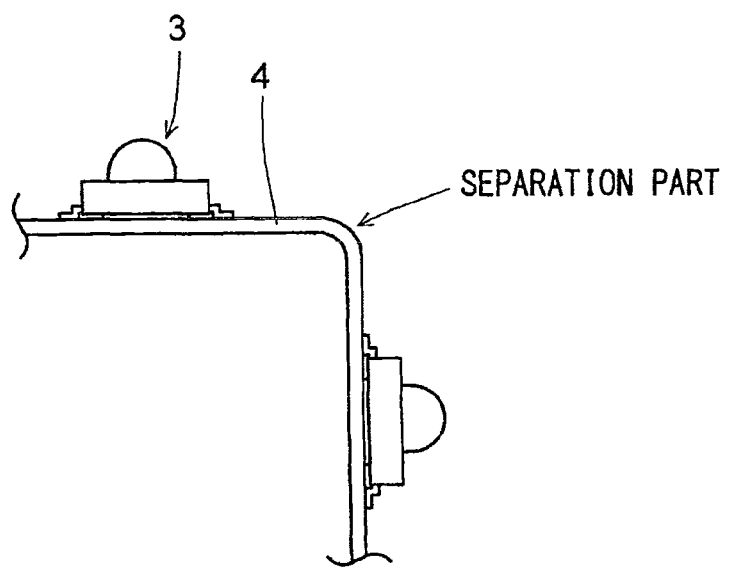
FIG. 5B A diagram illustrating an example in which no defect occurs when an FPC with LEDs mounted thereon is bent.

On the other hand, as shown in FIG. 5B, when a separation part between different heat dissipation conductors 43 is located at the midpoint between two LEDs 3 and 3, bending of the FPC 4 at the separation part does not affect the LED 3, making the LED 3 less likely to come off from the FPC 4.

Figure 6:
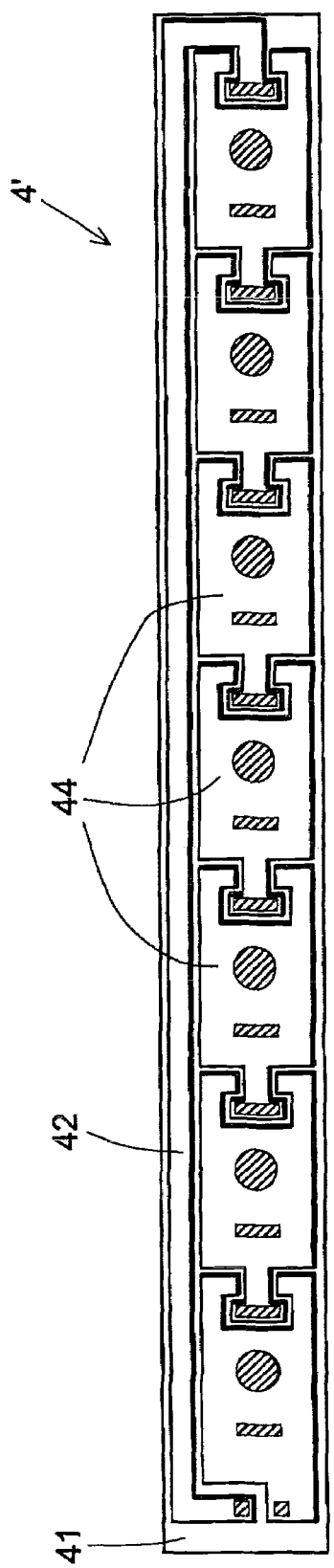
FIG. 6 A plan view showing another configuration of conductors on an FPC.

Another embodiment of the FPC is shown in FIG. 6. Compared with the FPC 4 shown in FIG. 3, the FPC 4' shown in FIG. 6 differs in that the mounting conductor 42 (shown in FIG. 3) connected to the electrode terminal 33a of the LED 3 and the heat dissipation conductor 43 (shown in FIG. 3) are made integral with each other.

In the FPC 4 shown in FIG. 3, the mounting conductor 42 connected to the electrode terminal 33a of the LED 3 and the heat dissipation conductor 43 have the same potential through the metal slug 31. Thus, in the FPC 4' shown in FIG. 6, the mounting conductor and the heat dissipation conductor are made integral with each other to form a large-area heat dissipation conductor 44, which dissipates a larger amount of heat. Note that, here, the application of the conductive adhesive and the mounting of the LED 3 and the connector C proceed in similar manners as in the above-described embodiment, and therefore no overlapping description will be repeated.

As the conductive adhesive, apart from solder or Ag paste mentioned above, any conventionally known material may be used. Nevertheless, since it is preferable that the conductive adhesive have high heat conductivity, solder is suitable.

The invention claimed is:

1. A backlight device comprising:
   a light guide plate; and
   a plurality of point light sources mounted on a flexible printed circuit board disposed near a side surface of the light guide plate,
   wherein
   a point light source comprises a semiconductor light emitting device, a metal slug fitted with the semiconductor device, and an electrode terminal, part of the metal slug being exposed at a mounting surface side,
   the flexible printed circuit board comprises a mounting conductor connected to the electrode terminal of a point light source, and a heat dissipation conductor corresponding to a point light source and separated from an adjacent heat dissipation conductor so as not to conduct to one another,
   the electrode terminal of a point light source and a mounting conductor of the flexible printed circuit board are bonded together with a conductive adhesive, and
   the metal slug of a point light source and a heat dissipation conductor of the flexible printed circuit board are bonded together with the same conductive adhesive.

2. The backlight device according to claim 1, wherein two adjacent heat dissipation conductors are separated from each other substantially at a midpoint between two adjacent point light sources.

3. The backlight device according to claim 1, wherein on a mounting surface of the flexible printed circuit board, a white resin layer is formed.

4. A planar display device, comprising:
   a display panel; and
   a backlight device fitted on a back surface side of the display panel,
   wherein the backlight device is the backlight device according to claim 1.

* * * * *